United States Patent [19]

Dumbri et al.

[11] Patent Number: 4,494,220
[45] Date of Patent: Jan. 15, 1985

[54] FOLDED BIT LINE MEMORY WITH ONE DECODER PER PAIR OF SPARE ROWS

[75] Inventors: Austin C. Dumbri, Easton; Frank J. Procyk, Center Valley, both of Pa.

[73] Assignee: AT&T Bell Laboratories, Murray Hill, N.J.

[21] Appl. No.: 444,239

[22] Filed: Nov. 24, 1982

[51] Int. Cl.³ .............................................. G11C 11/40
[52] U.S. Cl. .................................. 365/200; 365/189; 365/210
[58] Field of Search ......................... 365/189, 200, 210

[56] References Cited

U.S. PATENT DOCUMENTS

| 4,228,528 | 10/1980 | Cenker et al. | 365/200 |
| 4,274,013 | 6/1981 | Clemons et al. | 307/530 |
| 4,351,034 | 9/1982 | Eaton et al. | 365/189 |

*Primary Examiner*—Terrell W. Fears
*Attorney, Agent, or Firm*—Irwin Ostroff

[57] ABSTRACT

A folded bit line configured DRAM, with standard even and odd rows of memory cells, also includes spare even and odd rows of memory cells which can be substituted for standard rows found to have defective cells or interconnections. Each of the decoders associated with a standard row includes provision for being disconnected if found to be associated with a defective row. One common spare decoder is associated with one spare even and one spare odd row of memory cells. Each spare decoder is designed normally to be deselected for any address but to be able to assume the address of any disconnected standard row. Disconnection of a standard decoder and substitution of a spare decoder with the appropriate even or odd row are made possible by appropriate inclusion of fusible links which are selectively opened by laser irradiation. The use of one spare decoder with both an even and odd row serves to reduce the number of needed spare decoders and thus reduces overall chip size.

6 Claims, 3 Drawing Figures

FOLDED BIT LINE MEMORY WITH ONE DECODER PER PAIR OF SPARE ROWS

FIELD OF THE INVENTION

This invention relates to random access semiconductor memories and, in particular, to folded bit line type memories which use redundancy to improve yields.

BACKGROUND OF THE INVENTION

U.S. Pat. No. 4,228,528 describes a semiconductor memory chip that includes spare rows and columns of memory cells, spare decoders, and other various spare circuitry. Each spare row has a separate decoder. One problem is that the pitch (width) of a spare row decoder is substantially greater than the pitch (width) of a spare row, and accordingly the area of the silicon chip increases and yield correspondingly decreases.

It is desirable in folded bit line type semiconductor memories to use spare rows but to reduce the number of spare decoders per spare row from the 1:1 ratio of the above-described memory.

SUMMARY OF THE INVENTION

This invention relates to the inclusion of spare odd and even rows of memory cells in an integrated circuit memory chip which uses a folded bit line configuration. A standard row decoder associated with one standard even or odd row of memory cells is normally operative but can be readily disabled if desired. A single spare row decoder circuit is coupled to a pair of spare rows of memory cells which include an odd and even spare row which can be substituted for a defective standard odd or even row of memory cells. The spare decoder circuit, while normally inoperative or deselected, is designed to be allowed to be made operative if there is a defective standard row of memory cells which needs a substitute therefor.

The spare row decoder circuits typically have a much greater pitch (width) than the spare rows of memory cells they couple to. This results in difficulties in chip layout. The use of one spare row decoder coupled to an even and odd spare row eases the layout problem and tends to result in a reduction in the overall area of the total memory chip. This area reduction tends to increase yields and thereby lowers chip costs compared to a standard approach which would use one spare decoder circuit per spare row.

These and other features and advantages of the invention are better understood from consideration of the following detailed description taken in conjunction with the accompanying drawing.

DETAILED DESCRIPTION

Figure 1:
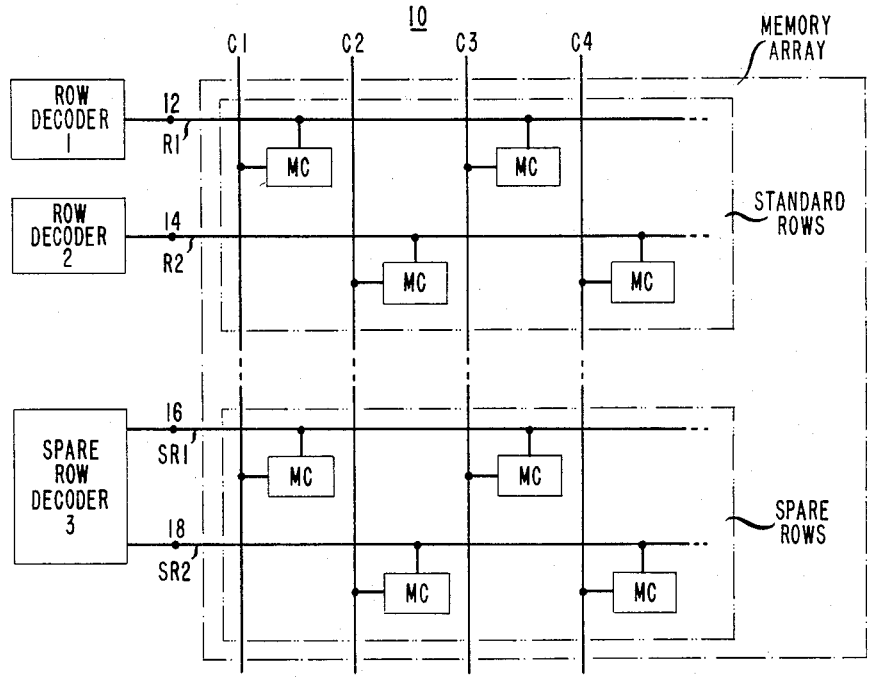
FIG. 1 illustrates in simplified schematic form portions of a memory in accordance with the invention.

Referring now to FIG. 1, there is illustrated a portion of a memory 10 in which a plurality of standard and spare memory cells MC is arranged in a two-dimensional array of rows and columns. Each cell MC is accessed by one or row conductors R1, R2, SR1, SR2, and one of column conductors C1, C2, C3, C4. Only the first two of N rows and the first four of M columns of standard memory cells MC are illustrated along with only the two rows of spare memory cells MC. The row and column conductors are usually denoted as word lines and bit lines, respectively.

Memory 10 is arranged in a folded bit line type of configuration with cells MC of selective adjacent rows being staggered as illustrated. The standard cells MC are coupled through R1 and R2, respectively, to nodes 12 and 14, respectively, and to first and second standard decoder circuits 1 and 2, respectively. The spare cells MC are coupled through SR1 and SR2, respectively, to nodes 16 and 18, respectively, and to a single spare decoder circuit 3. The row configuration of the standard cells MC coupled to R1 is the same as the row configuration of spare cells MC coupled to SR1. These rows are denoted as odd rows. The configuration of the standard cells MC coupled to R2 is the same as the configuration of spare cells MC coupled to SR2. These rows are denoted as even rows. If there is a defective standard cell MC or word line (standard row conductor), then an even spare row of cells MC can be substituted for an even standard row of cells MC, and an odd spare row of cells MC can be substituted for an odd row of standard cells MC.

Figure 2:
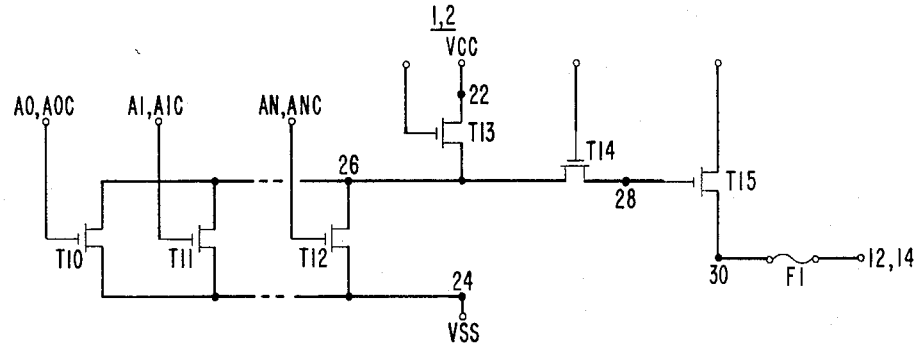
FIG. 2 illustrates in circuit schematic form a standard decoder which includes provision for disabling the decoder.
Figure 3:
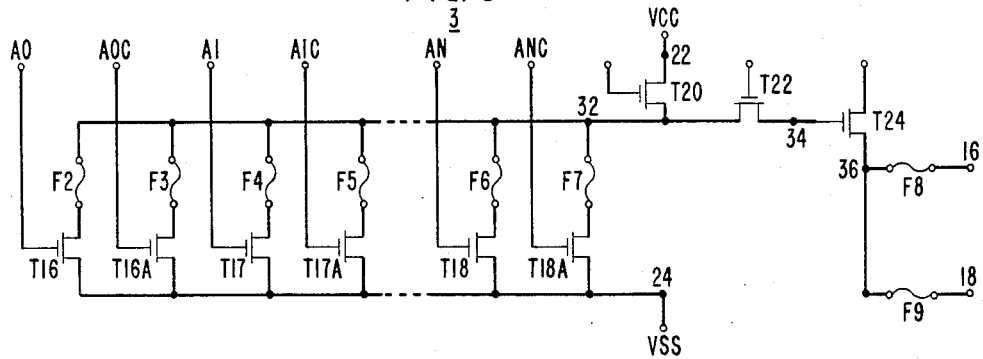
FIG. 3 illustrates in circuit schematic form an illustrative spare decoder with provision for enabliing or disabling the spare decoder in accordance with the invention.

There is only one spare row decoder circuit 3 per pair of spare row of cells MC which include an even and an odd spare row. A standard approach would be to use a spare decoder for each spare row whether the row be even or odd. The present use of a single spare decoder per pair of spare rows reduces the overall size of the memory chip and makes layout easier. In FIG. 2, there is illustrated a suitable decoder circuit 1, 2 for use with the standard word lines R1, R2. As is known in the art, each decoder is selected by an address unique to it made up of a distinctive combination of binary pulses. As a consequence, to select a particular one of 256 rows, an eight-digit address is required. In FIG. 3 there is illustrated a suitable spare decoder circuit 3 for use with the spare rows.

Turning now to FIG. 2, the decoder circuit 1, 2 is of a kind well known in the art. Decoder circuit 1, 2 basically comprises a parallel group of MOS address decoding transistors T10, T11, and T12 (one for each digit of the address to be decoded), a precharge transistor T13, an interrupt transistor T14, a driver transistor T15, and a fusible link F1. For simplicity, only three of the address decoding transistors T10, T11, and T12 are shown. Each of the drains of T10, T11, T12, and T14, and the source of T13, are coupled to a common node 26. The drain of T13 is coupled to a node 22 and to a voltage source VDD. The source of T14 is coupled to the gate of T15 and to a node 28. The sources of T10, T11, and T12 are all coupled to a node 24 and to a voltage source VSS which is typically, but not necessarily, ground potential. Interrupt transistor T14 serves as a transmission gate permitting selective isolation of the high capacitance on node 26 from the gate (terminal 28) of driver transistor T15. The on-off state of transistor T14 is controlled by an appropriate control pulse applied to its gate. As is well known to workers in the art, a particular decoder of the kind shown is selected when all of the inputs to the decoding transistors T10, T11, and T12, supplied from addressing circuits (not illustrated), are low, in which case node 26 is maintained high, and the associated driver transistor T15, whose gate is controlled by the voltage on node 28 is kept on, permitting a high drive voltage provided on the source of transistor T15 to be applied to output node 30 and through F1 to nodes 12 or 14 of the standard memory array. If the particular decoder is to be deselected (not selected), one of the inputs applied to it from the addressing circuits is high, in which case the voltage on node 26 drops to approximately VSS, and transistor T15 turns off whereby no drive voltage reaches node 30. As previously mentioned, a fusible line F1 is included in each of the standard decoders, and this link is left undisturbed if the particular decoder and its associated cells are to be retained in the standard array, as is the case if prior testing has determined that the cells to be accessed by way of its associated conductor are all defect-free. However, if the prior testing has established that any cell to be accessed by it is defective and so not fit for use in the memory, the link in the decoder is opened, advantageously by laser vaporation.

In a preferred embodiment, the link opened is a layer of polysilicon doped to be highly conductive, about 6000 Angstroms thick, about 10 microns long, and about 2 microns wide, and it is opened by being vaporized by incident high energy pulses provided by a 1.06 or 0.53 micron YAG laser. Advantageously, this is done after the memory chip fabrication is essentially complete by which time the polysilicon conductor will have been covered with a phosphorus doped glass which, however, is transparent to the radiation.

In FIG. 3 there is shown a spare decoder 3 of the kind that advantageously is coupled to the pair of row conductors SR1, SR2 associated with each spare row. This decoder advantageously is of a design that requires nothing to be done if the associated spare row is not to be used. However, if it is to be used, its substitution can be effected by making simple disconnections in the same manner as is used to disable rows of the standard array found to have defective cells.

Consistent with the requirements indicated previously, decoder circuit 3 makes it feasible to substitute conveniently one of the spare rows for any one of the standard rows found defective. Spare row decoder circuit 3 can be tailored to have any standard row address. To this end, each spare decoder circuit 3 comprises a plurality of transistor pairs T16A, T16B, T17A, T17B, and T18A and T18B, one of each pair for the address and the other its complement, and the number of address decoding transistor pairs matches the number of bits in the decoded address as with a standard decoder. For the sake of simplicity, again only three pairs of transistors are shown. The sources of each of the decoder transistors T16A, T16B, T17A, T17B, T18A, and T18B are coupled through separate fusible links F2, F3, F4, F5, F6, and F7, respectively, to the drain of a precharge transistor T20, to the source of an interrupt transistor T22, and to a node 32. The drains of all of the decoder transistors are coupled together to a node 24 and to a potential source VSS which is typically, but not necessarily, ground potential. The drain of T22 is coupled to the gate of driver transistor T24 and to a node 34. The drain of T24 is coupled to one side of each of fusible links F8 and F9. The other sides of F8 and F9 are coupled to nodes 16 and 18, respectively. An enabling pulse to the gate of the precharge transistor T20 results in the periodic applicaton of a voltage at or close to VDD on node 32. As with the standard decoder circuit 1, 2, interrupt transistor T22 serves as a transmission gate to selectively isolate the driver transistor T24 from the high capacitance of node 32. Driver transistor T24, when gated on by a high voltage on node 34 (the selected state) by way of tranmission gate T22, permits a high voltage supplied to its source to be applied to the terminal 36 which supplies the corresponding spare row conductors coupled to nodes 16 and 18.

Selective activation of a spare decoder is provided by inclusion of a separate fusible link F2, F3, F4, F5, F6, and F7 advantageously in the drain path of each of decoding transistors T16A, T16B, T17A, T17B, T18A, and T18B, respectively, of the kind used in the output of the standard decoder circuit 1, 2. Prior to laser fusion of any of the links, each spare decoder circuit 3 is deselected during every reading or writing operation because both an address and its complement appear on the address decoding transistor gates as indicated, ensuring that the potential of node 32 stays near that of node 24. When the need for a spare row has been determined, and it is decided to activate a specific spare row, the address of a faulty row is given to the decoder circuit 3 associated with the selected row by fusing open the appropriate links. In particular, one of the two links in each transistor pair will be opened so that thereafter each spare decoder will be selected by a unique combination of binary digits applied to the spare decoding transistors remaining connected between nodes 32 and 24. When the spare decoder has been properly coded, it will function indistinguishably from a standard decoder and will be selected when the input pulses are all low, thereby maintaining the voltage on node 32 high, whereby the driver transistor T24 is enabled, permitting a high voltage to be established on node 36 corresponding to the associated row conductor. If it is desired to replace an odd standard row, then link F9 is fused open. If it is desired to replace an even row, then link F8 is fused open. If there are defective spare memory cells in the spare row selected, then the fusible link associated therewith is opened and the selected spare decoder effectively becomes deselected.

A 256K DRAM, fabricated on a single silicon chip and using a switched capacitor type memory cell and a folded bit line configuration, has been fabricated and found to be functional. The memory was divided into two sub-memories each having 128K. Four pairs of spare rows, each pair, which comprises an even and odd row, having a separate spare row decoder circuit 3, are used with each sub-array.

It is to be understood that various modifications may be made in the basic decoders described consistent with the spirit of the invention. In particular, other techniques may be employed for enabling or disabling the decoding transistors. Also, the decoding transistors may take some other suitable form, such as bipolar transistors. Additionally, the decoders shown have been described for use both as the row decoders but can be used as column decoders. In some instances, it may be desirable to employ different forms of decoders for the rows and for the columns, particularly if the address length is different for the two. In some instances, as known in the art, it may be desirable to do the selecting in two steps, using a first group of decoders for part of the address and a second group for the second part of the address, as is done for column selection in the memory described in the commonly assigned U.S. Pat. No. 4,274,013.

What is claimed is:

1. A semiconductor memory comprising:

an array of standard memory cells arranged in a folded bit line configuration of even and odd rows and columns and an array of spare memory cells arranged in a folded bit line configuration of rows;

a single separate standard row decoder circuit being coupled to each even and to each odd row of standard memory cells, each standard decoder circuit including means for decoupling same from the associated row of standard memory cells;

a single separate spare row decoder circuit being coupled to one even and to one odd row of spare memory cells, each spare decoder circuit includes first means for decoupling same from one or both of the associated rows of spare memory cells; and each spare row decoder circuit includes second means for providing same with the address of a standard row decoder circuit which has been decoupled from the associated row because of a defect of that row or of the memory cells associated therewith such that the spare row is effectively substituted for the standard row.

2. The memory of claim 1 wherein the spare row decoder circuits are designed to be normally deselected for any address.

3. The memory of claim 2 where:
the means included in each of the standard row decoder circuits is a fusible link which, when opened, disconnects the row decoder from the standard rows;
the first means included in each of the spare row decoder circuits is a pair of fusible links which, when both are opened, disconnects the spare decoder from the spare rows, and with one open, leaves the spare row decoder circuit coupled to just an even or an odd spare row.

4. The memory of claim 3 wherein the second means included in each of the spare row decoders is a plurality of pairs of fusible links, said spare row decoders being given a desired address by the opening of a combination of such links.

5. The memory of claim 4 wherein each spare row decoder circuit includes a plurality of pairs of decoding transistors, each of which includes a fusible link in its circuit.

6. The memory of claim 5 wherein all the components thereof are formed on a single chip.

* * * * *